(12) United States Patent
Glenn et al.

(10) Patent No.: US 6,548,759 B1
(45) Date of Patent: Apr. 15, 2003

(54) PRE-DRILLED IMAGE SENSOR PACKAGE

(75) Inventors: Thomas P. Glenn, Gilbert, AZ (US);
Steven Webster, Muntinlupa (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/895,994

(22) Filed: Jun. 28, 2001

(51) Int. Cl.[7] .............................................. H01L 23/02
(52) U.S. Cl. ...................... 174/52.4; 257/673; 257/680; 257/676
(58) Field of Search ................................ 257/778, 680, 257/676, 673; 174/52.4, 52.2

(56) References Cited

U.S. PATENT DOCUMENTS

| | | | |
|---|---|---|---|
| 5,594,275 A | 1/1997 | Kwon et al. ................. 257/686 |
| 5,608,262 A | 3/1997 | Degani et al. ............... 257/723 |
| 5,952,714 A | * 9/1999 | Sano et al. .................. 257/680 |
| 5,973,393 A | 10/1999 | Chia et al. .................. 257/690 |
| 6,020,629 A | 2/2000 | Farnworth et al. ........... 257/686 |
| 6,144,507 A | 11/2000 | Hashimoto ................... 359/819 |
| 6,154,370 A | 11/2000 | Degani et al. ............... 361/761 |
| 6,208,019 B1 | * 3/2001 | Tane et al. ................... 257/679 |
| 6,287,893 B1 | 9/2001 | Elenius et al. .............. 438/108 |
| 6,291,259 B1 | 9/2001 | Chun .......................... 438/106 |
| 6,326,244 B1 | 12/2001 | Brooks et al. .............. 438/124 |
| 6,384,472 B1 | * 5/2002 | Huang ......................... 257/680 |

OTHER PUBLICATIONS

US patent application publication US 2001/0054758 by Isaak (Dec. 27 2001).

* cited by examiner

*Primary Examiner*—Hung V. Ngo
(74) *Attorney, Agent, or Firm*—Gunnison, McKay & Hodgson, L.L.P.; Serge J. Hodgson

(57) ABSTRACT

An image sensor package includes a substrate having a central aperture. Electrically conductive traces on a lower surface of the substrate include tabs projecting below and under hanging the central aperture. An image sensor is flip chip mounted to the tabs and thus supported in the central aperture by the tabs. By mounting the image sensor in the central aperture, the resulting image sensor package is relatively thin.

23 Claims, 4 Drawing Sheets

PRE-DRILLED IMAGE SENSOR PACKAGE

BACKGROUND OF THE INVENTION

1. Field of the Invention

The present invention relates generally to the packaging of electronic components. More particularly, the present invention relates to an image sensor package.

2. Description of the Related Art

Image sensors and assemblies are well known to those of skill in the art. In these assemblies, an image sensor was located within a housing, which supported a window. Radiation passed through the window and struck the image sensor, which responded to the radiation.

In one conventional image sensor assembly, an image sensor was mounted to a printed circuit mother board. After the image sensor was mounted, a housing was mounted around the image sensor and to the printed circuit mother board. This housing protected the image sensor, while at the same time, supported a window above the image sensor.

As the art moves to smaller and lighter weight electronic devices, it becomes increasingly important that the size of the image sensor assembly used within these electronic devices is small. Disadvantageously, the conventional image sensor assembly described above required a housing to support the window and to protect the image sensor. However, this housing was relatively bulky and extended upwards from the printed circuit mother board a significant distance. Accordingly, the image sensor assembly was not well-suited for use with smaller and lighter weight electronic devices.

SUMMARY OF THE INVENTION

In accordance with the present invention, an image sensor package includes a substrate having a central aperture. Electrically conductive traces on a lower surface of the substrate include tabs projecting below and under hanging the central aperture. An image sensor is flip chip mounted to the tabs and thus supported in the central aperture by the tabs. A window covers and protects an active area of the image sensor. Of importance, the active area is unobstructed by the tabs.

Advantageously, the image sensor package is relatively thin compared to prior art image sensor assemblies. In particular, by mounting the image sensor in the central aperture, the thickness of the image sensor package is minimized. Accordingly, the image sensor package is well suited for use with miniature lightweight electronic devices, which require thin and lightweight image sensor assemblies.

Also in accordance with the present invention, a method of forming an image sensor package includes forming a central aperture and interconnection ball apertures in a substrate. Traces are formed on a lower surface of the substrate, the traces having tabs projecting beyond a sidewall of the central aperture. Further, ends of the traces seal the interconnection ball apertures at the lower surface of the substrate.

An image sensor is supported in the central aperture by the tabs. Interconnection balls are formed in the interconnection ball apertures, the interconnection balls being electrically connected to the ends of the traces.

These and other features and advantages of the present invention will be more readily apparent from the detailed description set forth below taken in conjunction with the accompanying drawings.

BRIEF DESCRIPTION OF THE DRAWINGS

FIG. 3 is a cross-sectional view of the array along the line III—III of. FIG. 2.

In the following description, the same or similar elements are labeled with the same or similar reference numbers.

DETAILED DESCRIPTION

Figure 1:
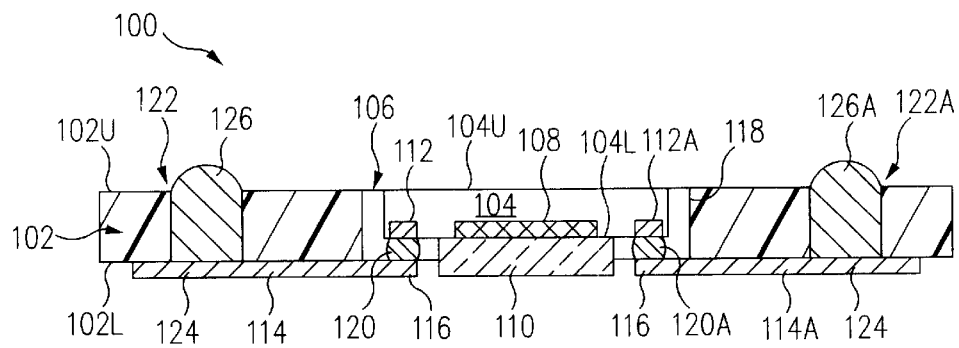
FIG. 1 is a cross-sectional view of an image sensor package in accordance with one embodiment of the present invention.

In accordance with the present invention, an image sensor package 100 (FIG. 1) includes a substrate 102 having a central aperture 106. Electrically conductive traces 114 on a lower surface 102L of substrate 102 include tabs 116 projecting below and under hanging central aperture 106. An image sensor 104 is flip chip mounted to tabs 116 and thus supported in central aperture 106 by tabs 116. A window 110 covers and protects an active area 108 of image sensor 104. Of importance, active area 108 is unobstructed by tabs 116.

Advantageously, image sensor package 100 is relatively thin compared to prior art image sensor assemblies. In particular, by mounting image sensor 104 in central aperture 106, the thickness of image sensor package 100 is minimized. Accordingly, image sensor package 100 is well suited for use with miniature lightweight electronic devices, which require thin and lightweight image sensor assemblies.

More particularly, FIG. 1 is a cross-sectional view of an image sensor package 100 in accordance with one embodiment of the present invention. Referring to FIG. 1, package 100 includes a substrate 102 and an image sensor 104 mounted in a central aperture 106 of substrate 102. In this embodiment, central aperture 106 is at, or near, the center of substrate 102. However, in other embodiments, central aperture 106 is offset from the center of substrate 102.

Central aperture 106 is defined by a sidewall 118, which extends from a lower, e.g., first, surface 102L of substrate 102 to an upper, e.g., second, surface 102U of substrate 102. In one embodiment, sidewall 118 includes an edge coating (not shown). This edge coating prevents fibers or particles from flaking off of sidewall 118. See Glenn, U.S. Pat. No. 5,867,368, which is incorporated herein by reference in its entirety, regarding use of edge coatings to prevent substrate particle generation.

Generally, it may be important to have an edge coating when substrate 102 is a material that has a tendency to generate particulates, e.g., is printed circuit board. However, when substrate 102 is a material that does not have a tendency to generate particulates, e.g., is ceramic or tape, an edge coating is unnecessary.

Image sensor 104 includes an active area 108 on a lower, e.g., first, surface 104L of image sensor 104. Generally, active area 108 is responsive to radiation, e.g., electromagnetic radiation, as is well known to those of skill in the art. For example, active area 108 is responsive to infrared radiation, ultraviolet light, and/or visible light. Illustratively, image sensor 104 is a CMOS image sensor device, a charge coupled device (CCD), a pyroelectric ceramic on CMOS device, or an erasable programmable read-only memory device (EPROM) although other image sensors are used in other embodiments.

Mounted to lower surface 104L of image sensor 104 is a window 110. More particularly, window 110 covers and protects active area 108. Generally, window 110 is transparent to the radiation of interest, e.g., to the radiation to which active area 108 of image sensor 104 is responsive, as those of skill in the art will understand. In one embodiment, window 110 is borosilicate glass although other materials are used in other embodiments.

Image sensor 104 further includes a plurality of bond pads 112 on lower surface 104L of image sensor 104. Bond pads 112 are connected to the internal circuitry of image sensor 104.

Formed on lower surface 102L of substrate 102 are a plurality of electrically conductive traces 114, which include a first trace 114A. Substrate 102 is an electrical insulator or includes an electrically insulating layer on lower surface 102L. Generally, a conductive layer is formed and patterned or a conductive layer is selectively formed to form traces 114 as described further below.

Referring to trace 114A, a first end 116 of trace 114A projects laterally inwards beyond sidewall 118 and towards the center of central aperture 106 of substrate 102. In other words, end 116, hereinafter referred to as tab 116, hangs below central aperture 106. The other traces 114 have tabs 116 in a similar manner and so are not discussed further to avoid detracting from the principals of the invention.

Although the terms upper, lower, below, above and similar terms are used herein, it is understood that these terms are used generally and without a gravitational reference, i.e., package 100 can be oriented in a variety of fashions such as inverted from the view of FIG. 1.

Bond pads 112 are electrically connected to corresponding traces 114, and more particularly to corresponding tabs 116, by electrically conductive bumps 120, which include a first bump 120A. In one embodiment, electrically conductive bumps 120 are: (1) solder; (2) stud bumps, i.e., gold balls; (3) electrically conductive epoxy paste; or (4) electrically conductive epoxy film as are well known to those of skill in the art. Image sensor 104 is sometimes referred to as flip chip mounted to tabs 116.

As shown in FIG. 1, image sensor 104 is supported in central aperture 106 by tabs 116, and more generally, by traces 114. Tabs 116 extend laterally inwards below central aperture 106 to bond pads 112. However, tabs 116 extend laterally inwards only below a periphery of central aperture 106. Stated another way, tabs 116 do not extend inwards significantly beyond bond pads 112 and do not reach active area 108. Accordingly, active area 108 is unobstructed by tabs 116.

During use, radiation is directed at package 100 and image sensor 104. This radiation strikes window 110, passes through window 110, and strikes active area 108, which responds to the radiation. Of importance, tabs 116 do not obstruct this radiation.

However, in an alternative embodiment, active area 108 of image sensor 104 transmits radiation such as electromagnetic radiation. For example, image sensor 104 is a light emitting diode (LED) micro-display. In accordance with this embodiment, radiation transmitted by active area 108 passes through window 110 and emanates from package 100. For simplicity, in the above and following discussions, active area 108 as a receiver of radiation is set forth. However, in light of this disclosure, those of skill in the art will recognize that generally active area 108 can be a receiver of radiation, a transmitter of radiation, or a transceiver, i.e., a transmitter and a receiver, of radiation.

Substrate 102 is formed with interconnection ball apertures 122, sometimes called interconnection ball sites. Interconnection ball apertures 122 are covered at lower surface 102L by traces 114, and more specifically, by second ends 124 of traces 114. To illustrate, a first interconnection ball aperture 122A of the plurality of interconnection ball apertures 122 is covered at lower surface 102L by second end 124 of trace 114A. The other interconnection ball apertures 122 are covered at lower surface 102L by second ends 124 of the other traces 114 in a similar manner and so are not discussed further to avoid detracting from the principals of the invention.

Electrically conductive interconnection balls 126 are formed in and fill interconnection ball apertures 122. Stated another way, interconnection ball apertures 122 and traces 114 form pockets and interconnection balls 126 are formed in these pockets. In this manner, interconnection balls 126 are formed on and electrically connected to corresponding traces 114 and, more particularly, to second ends 124 of traces 114.

To illustrate, a first interconnection ball 126A of the plurality of interconnection balls 126 fills interconnection ball aperture 122A and is formed on and electrically connected to trace 114A. The other interconnection balls 126 fill the other interconnection ball apertures 122 and are formed on and electrically connected to the other trace 114 in a similar manner and so are not discussed further to avoid detracting from the principals of the invention.

To illustrate the electrical connection of interconnection balls 126 with bond pads 112, a first bond pad 112A of the plurality of bond pads 112 of image sensor 104 is electrically connected to trace 114A by bump 120A. Trace 114A is electrically connected to interconnection ball 126A.

As set forth above, an electrically conductive pathway between bond pad 112A and interconnection ball 126A is formed by bump 120A and trace 114A. The other bond pads 112, traces 114, bumps 120, and interconnection balls 126 are electrically connected to one another in a similar fashion so are not discussed further to avoid detracting from the principals of the invention.

Although a particular electrically conductive pathway between bond pad 112A and interconnection ball 126A is described above, in light of this disclosure, it is understood that other electrically conductive pathways can be formed. For example, instead of direct electrical connections between bond pads 112 and bumps 120, between bumps 120 and traces 114, and between traces 114 and interconnection balls 126, contact metallizations are interposed between the items.

Further, it is understood that the number of bond pads 112, bumps 120, traces 114, and interconnection balls 126 used depends upon the particular input/output requirements of image sensor 104. In addition, interconnection balls 126 are distributed in a variety of formats, e.g., in an array format to form a ball grid array (BGA) package.

In one embodiment, an upper, e.g., second, surface 104U of image sensor 104 is below upper surface 102U of substrate 102, i.e., image sensor 104 fits entirely within central aperture 106. Advantageously, interconnection balls 126 extend from traces 114 and lower surface 102L of substrate 102 through substrate 102 and protrude above upper surfaces 102U, 104U of substrate 102, image sensor 104, respectively.

Interconnection balls 126 are used to electrically connect package 100 to a larger substrate (not shown) such as a printed circuit mother board. More particularly, package 100 is mounted to the larger substrate such that upper surface 102U is adjacent and faces the larger substrate. Accordingly, lower surface 102L and window 110 are opposite and face away from the larger substrate in this embodiment.

In an alternative embodiment, upper surface 104U of image sensor 104 is above upper surface 102U of substrate 102. In accordance with this embodiment, interconnection balls 126 extend to a height above upper surface 102U of substrate 102 greater than the height of upper surface 104U of image sensor 104 above upper surface 102U of substrate 102 to provide an acceptable clearance between upper surface 104U of image sensor 104 and the larger substrate. Alternatively, the larger substrate is formed with an aperture corresponding to image sensor 104.

Advantageously, package 100 is relatively thin compared to prior art image sensor assemblies. In particular, by mounting image sensor 104 in central aperture 106, the thickness of package 100 is minimized. Accordingly, package 100 is well suited for use with miniature lightweight electronic devices, which require thin and lightweight image sensor assemblies.

Figure 2:
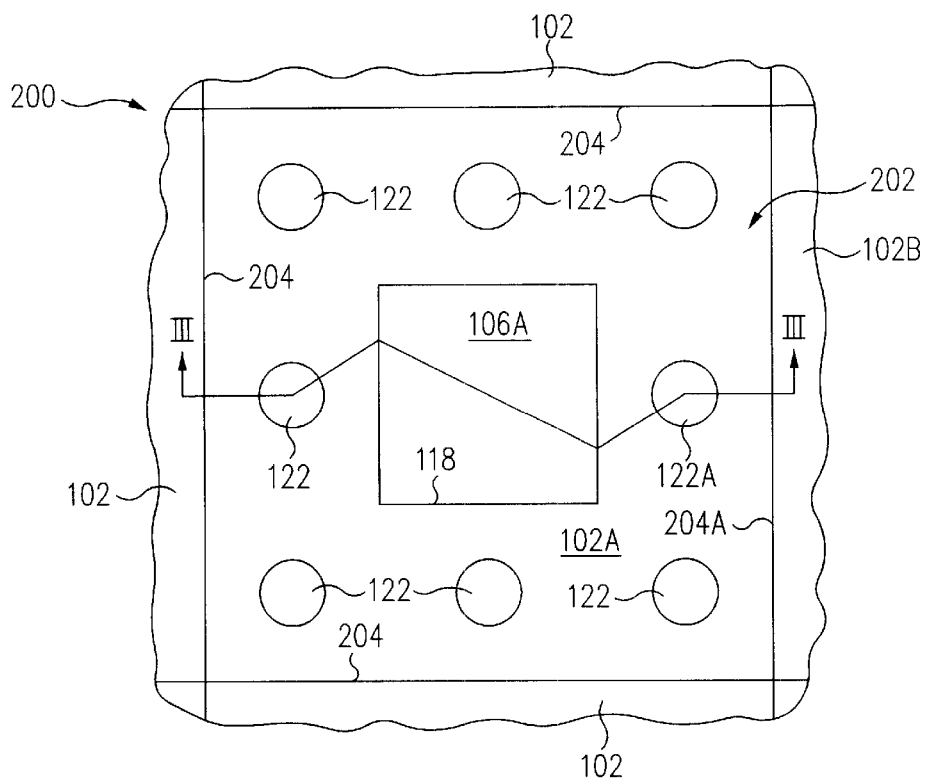
FIG. 2 is a top plan view of an array of image sensor packages during assembly in accordance with one embodiment of the present invention.
Figure 3:
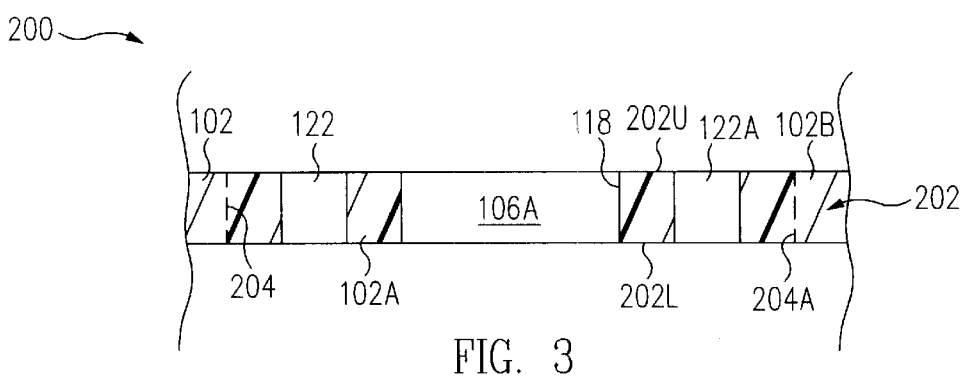

In one embodiment, package 100 is fabricated simultaneously with a plurality of packages 100 to minimize the cost associated with each individual package 100. FIG. 2 is a top plan view of an array 200 of image sensor packages 100 during assembly in accordance with one embodiment of the present invention. FIG. 3 is a cross-sectional view of array 200 along the line III—III of FIG. 2.

Referring now to FIGS. 2 and 3 together, array 200 includes an image sensor substrate 202. Image sensor substrate 202 includes a plurality of individual substrates 102 integrally connected together in an array format. For example, image sensor substrate 202 includes a 4×4 array of substrates 102 integrally connected together for a total of sixteen substrates 102, although it is understood that other array formats and number of substrates 102 are used in other embodiments.

Each of substrates 102 is delineated by a singulation street 204, which is located between adjacent substrates 102. For example, a first singulation street 204A of the plurality of singulation streets 204 delineates a first substrate 102A of the plurality of substrates 102 from a second substrate 102B of the plurality of substrates 102. The other substrates 102 are similarly delineated from adjacent substrates 102 by corresponding singulation streets 204.

Central apertures 106 are formed in image sensor substrate 202. More particularly, central apertures 106 are formed in substrates 102. For example, a first central aperture 106A of the plurality of central apertures 106 is formed in substrate 102A. The other central apertures 106 are formed in the other corresponding substrates 102 in a similar manner.

Central apertures 106 are formed using any one of a number of techniques, for example, by lasering, mechanically drilling, or punching. In one embodiment, edge coatings are formed to line sidewalls 118 of central apertures 106.

As shown in FIG. 2, central apertures 106 are rectangular, e.g., square. However, in alternative embodiments, central apertures 106 are formed in other shapes, e.g., central apertures 106 are circular.

Figure 4:
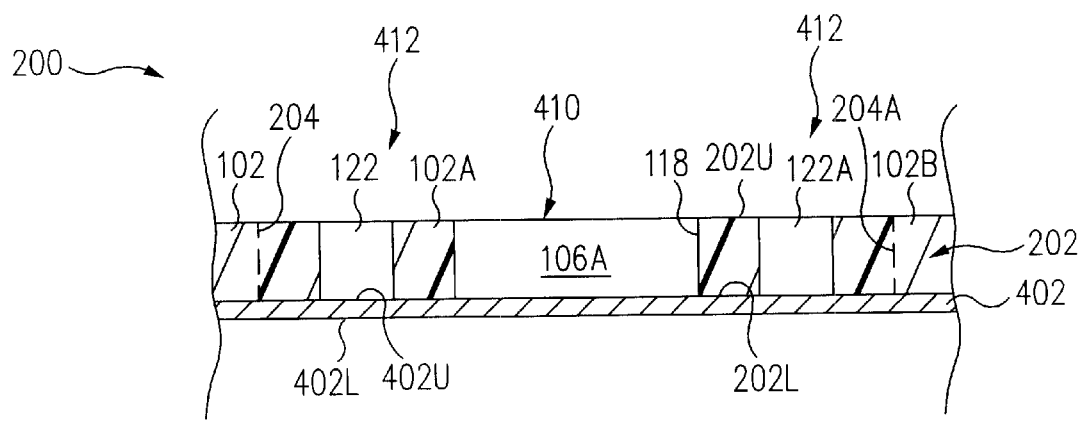
FIGS. 4 and 5 are cross-sectional views of the array of FIG. 3 at further stages during fabrication in accordance with embodiments of the present invention.

Interconnection ball apertures 122 are formed in image sensor substrate 202. More particularly, a plurality of interconnection ball apertures 122 are formed in each of substrates 102. For example, interconnection ball aperture 122A is formed in substrate 102A. Interconnection ball apertures 122 are formed using any one of a number of techniques, for example, by lasering, mechanically drilling, or punching FIG. 4 is a cross-sectional view of array 200 of FIG. 3 at a further stage during fabrication in accordance with one embodiment of the present invention. Referring now to FIG. 4, an upper, e.g., first, surface 402U of an electrically conductive sheet 402 is mounted to a lower, e.g., first, surface 202L of image sensor substrate 202, for example, with adhesive. Illustratively, sheet 402 is a metal foil, e.g., a copper foil.

Sheet 402 entirely covers lower surface 202L of image sensor substrate 202. More particularly, sheet 402 extends under and covers central apertures 106 and interconnection ball apertures 122 at lower surface 202L of image sensor substrate 202. Exposed regions 410, 412 of upper surface 402U of sheet 402 are exposed through central apertures 106, interconnection ball apertures 122, respectively.

Figure 5:
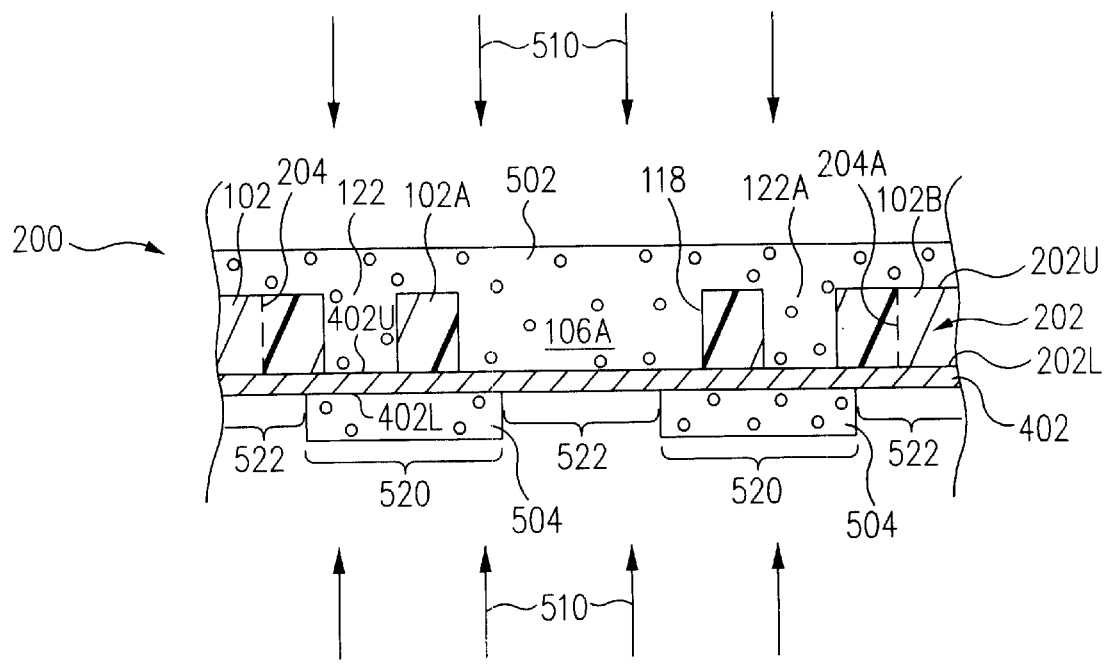

FIG. 5 is a cross-sectional view of array 200 of FIG. 4 at a further stage during fabrication in accordance with one embodiment of the present invention. Referring now to FIG. 5, an upper, e.g., first, mask 502, e.g., photoresist, is formed on an upper, e.g., second, surface 202U of image sensor substrate 202. Upper mask 502 fills central apertures 106 and interconnection ball apertures 122. Upper mask 502 contacts and protects exposed regions 410, 412 (FIG. 4) of upper surface 402U of sheet 402. Upper mask 502 is sometimes referred to as a blanket mask since upper mask 502 is formed non-selectively on upper surface 202U and thus blankets upper surface 202U.

A lower, e.g., second, mask 504 is formed on a lower, e.g., second, surface 402L of sheet 402. In contrast to upper mask 502, lower mask 504 selectively covers and protects lower surface 402L of sheet 402. More particularly, lower mask 504 covers and protects trace regions 520 of sheet 402 from which traces 114 are formed. Lower mask 510 exposes etch regions 522 of sheet 402, which are removed in a subsequent etching operation as described further below.

Lower mask 504 is formed using any one of a number of techniques. For example, photoresist is applied to lower surface 402L of sheet 402. The photoresist is selectively exposed to radiation, e.g., ultraviolet radiation. The exposed or not exposed regions of the photoresist are removed depending upon the type of photoresist used, e.g., positive or negative photoresist, to form lower mask 504.

Array 200 is subjected to an etchant 510 in an etching operation. Etchant 510 etches and removes etch regions 522 of sheet 402, which are exposed by lower mask 504. However, trace regions 520 of sheet 402, which are protected from above and below by upper mask 502 and lower mask 504, respectively, are not etched by etchant 510 and remain. In this manner, sheet 402 is patterned to form traces 114. Upper mask 502 and lower mask 504 are removed.

Figure 6:
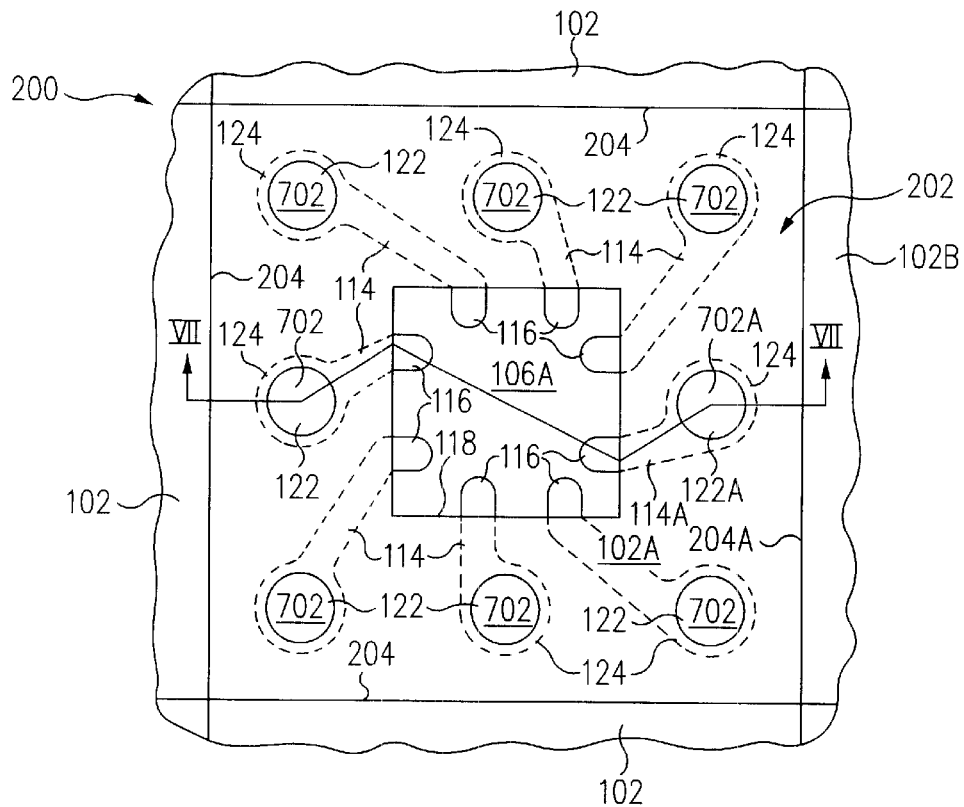
FIG. 6 is a top plan view of the array of FIG. 5 at a further stage during fabrication in accordance with one embodiment of the present invention.
Figure 7:
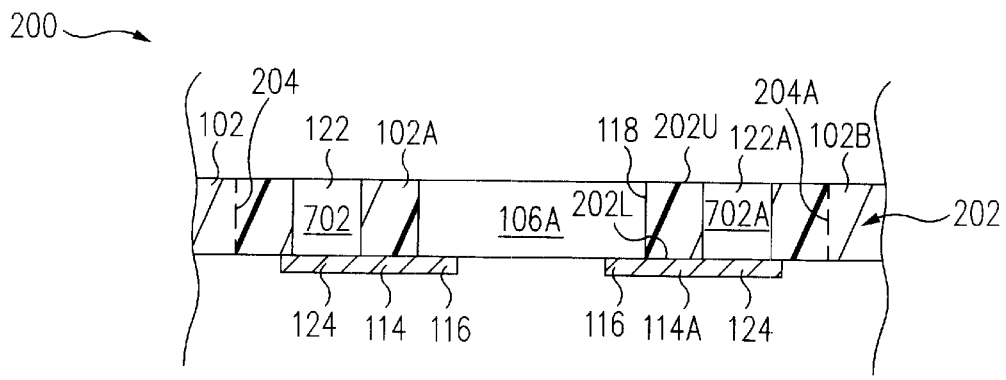
FIG. 7 is a cross-sectional view of the array along the line VII—VII of FIG. 6.

FIG. 6 is a top plan view of array 200 of FIG. 5 during assembly in accordance with one embodiment of the present invention. FIG. 7 is a cross-sectional view of array 200 along the line VII—VII of FIG. 6 in accordance with this embodiment of present invention.

Referring now to FIGS. 6 and 7 together, trace regions 520 of sheet 402 (FIG. 5) form traces 114. Tabs 116 of traces 114 project below and under hang central apertures 106 of substrates 102. Further, second ends 124 of traces 114 cover and seal interconnection ball apertures 122 at lower surface 202L of image sensor substrate 202, and more generally, and lower surfaces 102L of substrates 102.

To illustrate, tab 116 of trace 114A extends below and under hangs central aperture 106A of substrate 102A. Further, second end 124 of trace 114A covers and seals interconnection ball aperture 122A at lower surface 102U of substrate 102A. The other traces 114 extend below and under hang central apertures 106 and cover and seal the other interconnection ball apertures 122 in a similar manner and so are not discussed further to avoid detracting from the principals of the invention.

Referring now to FIG. 7, a plurality of pockets 702 are defined by interconnection ball apertures 122 and second ends 124 of traces 114. To illustrate, a first pocket 702A of the plurality of pocket 702 is defined by interconnection ball aperture 122A and second end 124 of trace 114A. The other pockets 702 are defined by the other interconnection ball apertures 122 and the other second ends 124 of traces 114 in a similar manner and so are not discussed further to avoid detracting from the principals of the invention.

Figure 8:
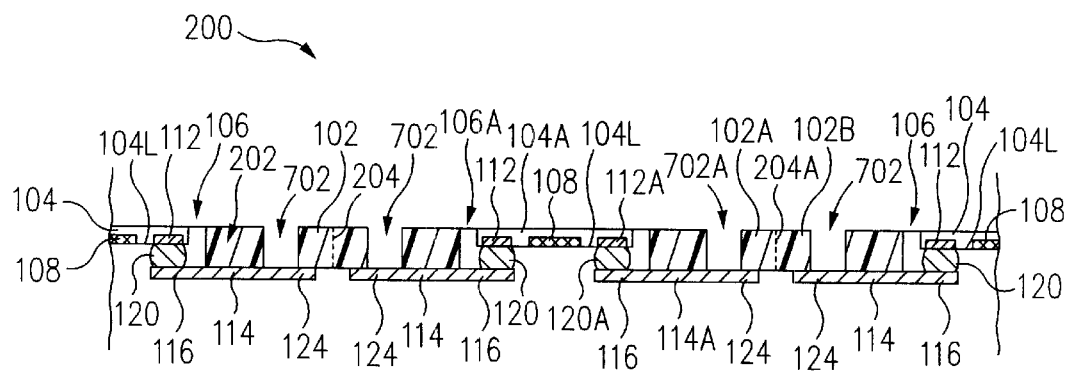
FIGS. 8, 9 and 10 are cross-sectional views of the array of FIG. 7 at further stages during fabrication in accordance with embodiments of the present invention.

FIG. 8 is a cross-sectional view of array 200 of FIG. 7 at a further stage during fabrication in accordance with one embodiment of the present invention. As shown in FIG. 8, image sensors 104 are generally mounted to substrates 102. For example, a first image sensor 104A of the plurality of image sensors 104 is mounted to first substrate 102A. The other image sensors 104 are mounted to corresponding substrates 102 in a similar manner.

More particularly, image sensors 104 are mounted to traces 114 and specifically to tabs 116 by bumps 120, sometimes called flip chip mounted to tabs 116. Image sensors 104 are supported in central apertures 106 by traces 114 and specifically by tabs 116. To illustrate, image sensor 104A is supported in central aperture 106A of substrate 102A. The other image sensors 104 are supported in the other central apertures 106 in a similar manner and so are not discussed further to avoid detracting from the principals of the invention.

To mount image sensors 104, bond pads 112 of each image sensor 104 are aligned with tabs 116 using any one of a number of alignment techniques, e.g., image sensors 104 are optically or mechanically aligned.

Bond pads 112 of image sensors 104 are attached to tabs 116 using any one of a number of techniques. For example, solder bumps 120 are formed on bond pads 112 of image sensors 104, or alternatively, on tabs 116, and solder bumps 120 are reflowed to attach bond pads 112 to tabs 116. Alternatively, bond pads 112 of image sensors 104 are attached to tabs 116 by bumps 120 formed of electrically conductive epoxy paste or film, which is thermally or optically cured.

As a further alternative, bond pads 112 of image sensors 104 are attached to tabs 116 by thermal or thermosonic bonding of gold bumps 120 formed on bond pads 112, or alternatively, on tabs 116. In light of this disclosure, those of skill in the art will understand that other methods of attaching image sensors 104 to tabs 116 can be used.

Generally, each bond pad 112 is electrically and physically connected to a corresponding tab 116 of traces 114 by a corresponding bump 120. To illustrate, bond pad 112A of image sensor 104A is electrically and physically connected to tab 116 of trace 114A by bump 120A. The other bond pads 112 are electrically and physically connected to the other tabs 116 by the other bumps 120 in a similar manner and so are not discussed further to avoid detracting from the principals of the invention.

Figure 9:
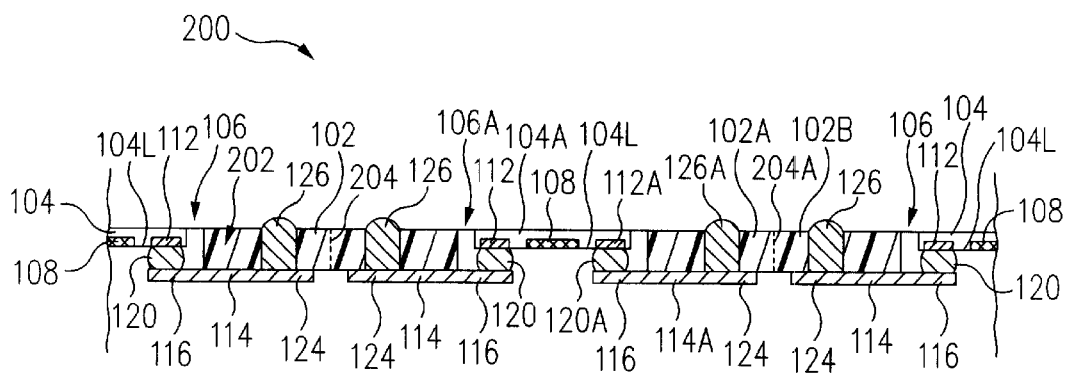

FIG. 9 is a cross-sectional. view of array 200 of FIG. 8 at a later stage during fabrication in accordance with one embodiment of the present invention. Referring now to FIGS. 8 and 9 together, image sensor substrate 202 is populated with interconnection balls 126.

More particularly, interconnection balls 126 are formed in pockets 702. Illustratively, a solder paste is applied to fill pockets 702 and this solder paste is reflowed to form interconnection balls 126. For example, solder paste is applied to fill pocket 702A and this solder paste is reflowed to form interconnection ball 126A. Interconnection ball 126A is formed on and electrically connected to trace 114A. The other interconnection balls 126 are formed in a similar manner and so are not discussed further to avoid detracting from the principals of the invention.

Figure 10:
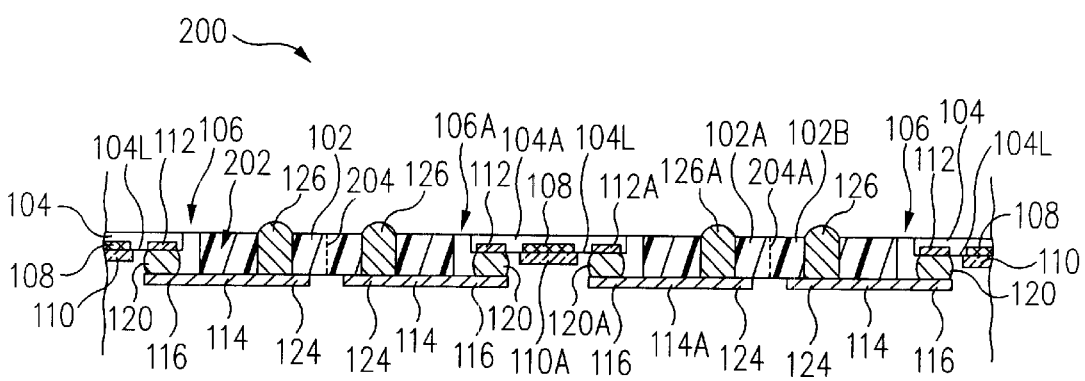

FIG. 10 is a cross-sectional view of array 200 of FIG. 9 at a later stage during fabrication in accordance with one embodiment of the present invention. As shown in FIG. 10, windows 110 are mounted to lower surfaces 104L of image sensors 104, e.g., using epoxy.

To illustrate, a first window 110A of the plurality of windows 110 is mounted to lower surface 104L of image sensor 104A. More particularly, window 110A covers and protects active area 108 of image sensor 104A. The other windows 110 are mounted to lower surfaces 104L of the other image sensors 104 in a similar manner and so are not discussed further to avoid detracting from the principals of the invention.

In an alternative embodiment, windows 110 are mounted to lower surfaces 104L of image sensors 104 before formation of interconnection balls 126. For example, windows 110 are mounted to lower surfaces 104L of image sensors 104 immediately after image sensors 104 are mounted to traces 114 (FIG. 8) and before formation of interconnection balls 126. In yet other alternative embodiments, windows 110 are mounted to lower surfaces 104L of image sensors 104 before image sensors 104 are mounted to traces 114 or, alternatively, windows 110 are not used.

Referring still to FIG. 10, array 200 is singulated into a plurality of individual image sensor packages 100 (FIG. 1) by singulating image sensor substrate 202 along singulation streets 204. Singulation is accomplished using any one of a number of singulation techniques, e.g., by laser cutting or mechanical sawing through image sensor substrate 202 along singulation streets 204.

By forming a plurality of packages 100 simultaneously, several advantages are realized. One advantage is that it is less labor intensive to handle and process a plurality of packages 100 simultaneously rather than to handle and process each package 100 on an individual basis. By reducing labor, the cost associated with each package 100 is minimized. However, in light of this disclosure, those of skill in the art will recognize that packages 100 can also be manufactured on an individual basis if desired.

This application is related to Glenn et al., co-filed and commonly assigned U.S. patent application Ser. No. 09/896, 074, entitled "PRE-DRILLED IMAGE SENSOR PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An image sensor package comprising:
   a substrate comprising a sidewall defining a central aperture of said substrate;
   electrically conductive traces coupled to a first surface of said substrate, said electrically conductive traces comprising tabs projecting beyond said sidewall;
   an image sensor supported in said central aperture by said tabs, wherein said image sensor comprises an active area on a first surface of said image sensor; and
   a window coupled to said first surface of said image sensor, said window covering and protecting said active area.

2. The image sensor package of claim 1 wherein said substrate further comprises a second surface, said sidewall extending from said first surface to said second surface.

3. The image sensor package of claim 1 wherein said substrate is selected from the group consisting of a printed circuit board, a ceramic and a tape.

4. The image sensor package of claim 1 wherein said image sensor package is one of a plurality of image sensor packages integrally connected together in an array.

5. The image sensor package of claim 1 wherein said image sensor comprises bond pads on said first surface of said image sensor.

6. The image sensor package of claim 5 further comprising electrically conductive bumps couplings said bond pads to said tabs.

7. The image sensor package of claim 1 wherein said active area is unobstructed by said tabs.

8. The image sensor package of claim 7 wherein said tabs extend below a periphery of said central aperture.

9. The image sensor package of claim 1 wherein said substrate further comprising interconnection ball apertures.

10. The image sensor package of claim 9 wherein ends of said traces and said interconnection ball apertures define pockets.

11. The image sensor package of claim 10 further comprising interconnection balls in said pockets.

12. The image sensor package of claim 9 wherein said interconnection ball apertures are covered at said first surface of said substrate by ends of said traces.

13. The image sensor package of claim 12 further comprising interconnection balls filling said interconnection ball apertures, said interconnection balls being electrically connected to said traces.

14. The image sensor package of claim 13 wherein said interconnection balls extend from said first surface of said substrate, through said substrate, and protrude above a second surface of said substrate.

15. The image sensor package of claim 1 wherein said image sensor is flip chip mounted to said tabs.

16. An image sensor package comprising:
    a substrate selected from the group consisting of a printed circuit board, a ceramic and a tape, said substrate comprising a first surface and a sidewall defining a central aperture of said substrate;
    electrically conductive traces coupled to said first surface of said substrate, said traces comprising tabs projecting beyond said sidewall, said traces further comprising ends;
    an image sensor comprising an active area and bond pads on a first surface of said image sensor, said image sensor supported in said central aperture of said substrate by said tabs;
    bumps physically and electrically coupling said bond pads to said tabs;
    interconnection balls formed in pockets defined by said ends and interconnection ball apertures of said substrate, said interconnection balls extending through said substrate and projecting above a second surface of said substrate; and
    a window coupled to said first surface of said image sensor, said window covering and protecting said active area.

17. The image sensor package of claim 16 wherein said image sensor is flip chip mounted to said traces.

18. The image sensor package of claim 16 wherein said image sensor package is one of a plurality of image sensor packages integrally connected together in an array.

19. The image sensor package of claim 16 wherein said tabs hang below said central aperture.

20. The image sensor package of claim 16 wherein said bumps comprise a material selected from the group consisting of solder, gold, electrically conductive epoxy paste and electrically conductive epoxy film.

21. The image sensor package of claim 16 wherein said active area is unobstructed by said traces.

22. The image sensor package of claim 16 wherein said sidewall extends from said first surface of said substrate to said second surface of said substrate.

23. The image sensor package of claim 16 wherein said interconnection balls are electrically coupled to said bond pads.

* * * * *